United States Patent
Lee et al.

(10) Patent No.: US 7,511,509 B2
(45) Date of Patent: Mar. 31, 2009

(54) SEMICONDUCTOR DEVICE AND TEST SYSTEM WHICH OUTPUT FUSE CUT INFORMATION SEQUENTIALLY

(75) Inventors: You-sang Lee, Seoul (KR); Jin-yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 11/605,224

(22) Filed: Nov. 29, 2006

(65) Prior Publication Data

US 2008/0094071 A1   Apr. 24, 2008

(30) Foreign Application Priority Data

Oct. 18, 2006   (KR) .................. 10-2006-0101559

(51) Int. Cl.
G01R 31/02   (2006.01)
(52) U.S. Cl. ..................................... 324/550
(58) Field of Classification Search ........... 324/550
See application file for complete search history.

(56) References Cited

U.S. PATENT DOCUMENTS

| | | | | |
|---|---|---|---|---|
| 5,677,917 A | * | 10/1997 | Wheelus et al. | 714/726 |
| 6,363,020 B1 | * | 3/2002 | Shubat et al. | 365/200 |
| 6,556,490 B2 | * | 4/2003 | Shubat et al. | 365/200 |
| 6,943,560 B1 | * | 9/2005 | Sirrine | 324/550 |
| 2005/0013187 A1 | * | 1/2005 | Anand et al. | 365/225.7 |

FOREIGN PATENT DOCUMENTS

| | | |
|---|---|---|
| JP | 07-182899 | 7/1995 |
| JP | 2005-302156 | 10/2005 |
| KR | 1020020061233 A | 7/2002 |
| KR | 1020030006935 A | 1/2003 |
| KR | 10-0484584 | 8/2005 |

* cited by examiner

Primary Examiner—Timothy J Dole
(74) Attorney, Agent, or Firm—Volentine & Whitt, P.L.L.C.

(57) ABSTRACT

A semiconductor device includes a plurality of fuses, and a plurality of latch circuits respectively electrically connected to the plurality of fuses. The plurality of latch circuits are configured to store respective fuse-cut information from the plurality of fuses, and to then sequentially transmit the fuse-cut information through the latch circuits to output sequential data indicative of a fuse-cut state of the plurality of fuses.

13 Claims, 3 Drawing Sheets

SEMICONDUCTOR DEVICE AND TEST SYSTEM WHICH OUTPUT FUSE CUT INFORMATION SEQUENTIALLY

BACKGROUND OF THE INVENTION

1. Field of the Invention

The present invention generally relates to semiconductor devices, and more particularly, the present invention relates the testing of fuses in semiconductor devices.

A claim of priority is made to Korean Patent Application No. 10-2006-0101559, filed on Oct. 18, 2006, in the Korean Intellectual Property Office, the entire disclosure of which is incorporated herein by reference.

2. Description of the Related Art

Fuses are utilized in semiconductor devices to perform a variety of functions, such as controlling the output of certain DC voltages of the semiconductor devices. Proper execution of these functions depends largely on precision cutting of selected fuses to create desired open circuit conditions. If selected fuses have not been reliably or accurately cut, the semiconductor device can suffer from degradation in performance.

SUMMARY OF THE INVENTION

According to an aspect of the present invention, a semiconductor device is provided which includes a plurality of fuses, and a plurality of latch circuits respectively electrically connected to the plurality of fuses. The plurality of latch circuits are configured to store respective fuse-cut information from the plurality of fuses, and to then sequentially transmit the fuse-cut information through the latch circuits to output sequential data indicative of a fuse-cut state of the plurality of fuses.

According to another aspect of the present invention, a semiconductor device is provided which includes first through n fuse sets each comprising at least one fuse, where n is a positive integer, and first through n latches. The first through n fuse sets output respective first through n fuse cut information indicative of whether the respective at least one fuse is in a cut state. The first through n latches respectively latch the first through n fuse cut information output from the respective first through n fuse sets. The first through n latches are configured to selectively transmit the first through n fuse cute information so as to be sequentially output from the $n^{th}$ latch.

According to yet another aspect of the present invention, a test system is provided which includes a plurality of fuses, a plurality of latch circuits, and a test device. The plurality of latch circuits are respectively electrically connected to the plurality of fuses, and are configured to store respective fuse-cut information from the plurality of fuses, and to then sequentially transmit the fuse-cut information through the latch circuits to output sequential data indicative of a fuse-cut state of the plurality of fuses. The test device which outputs fuse cut error information based on the sequential data indicative of the fuse-cut state of the plurality of fuses.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF EMBODIMENTS

Figure 1:
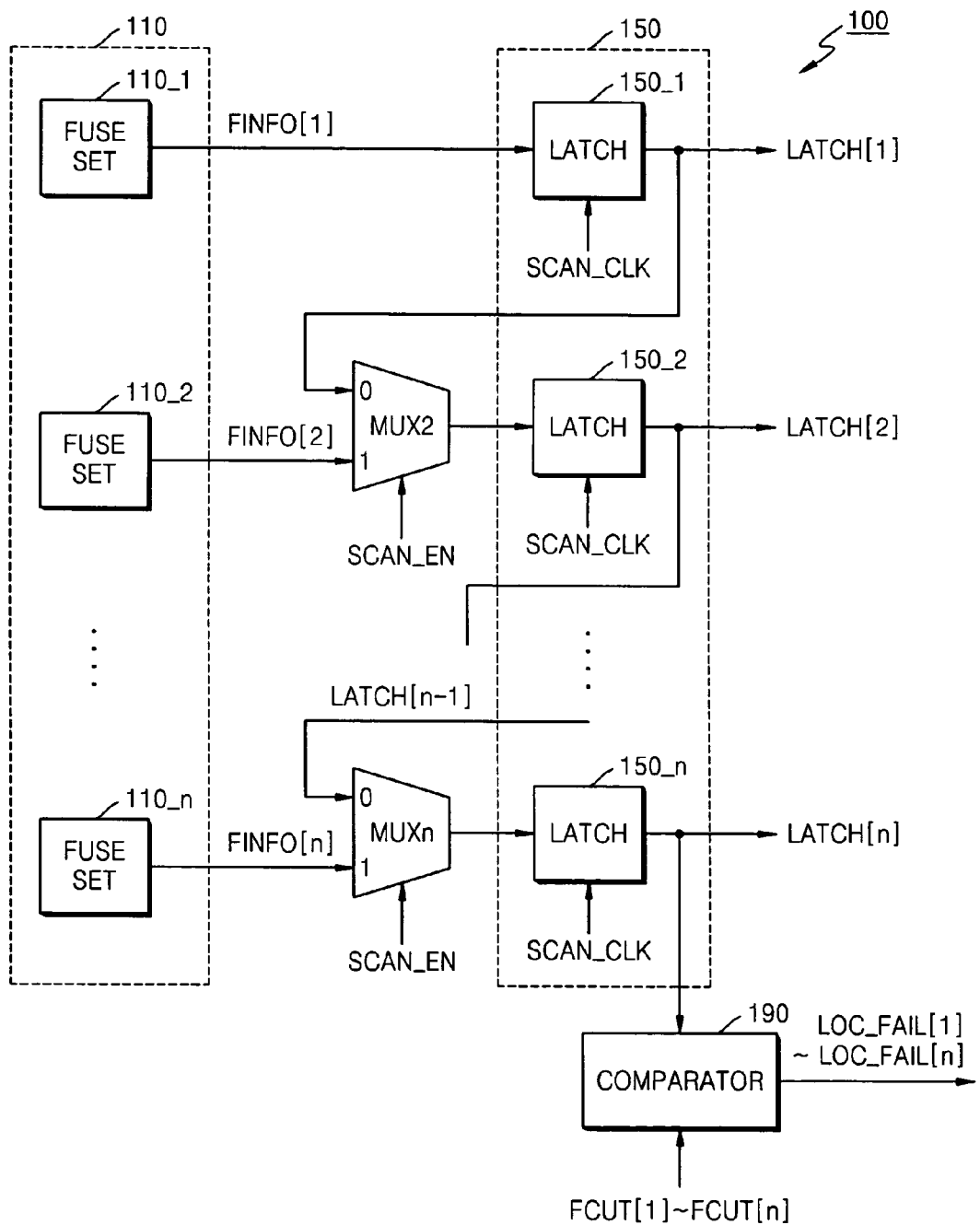
FIG. 1 is a block diagram of a semiconductor device according to an embodiment of the present invention.

Hereinafter, exemplary and non-limiting embodiments of the present invention will be described in detail with reference to the accompanying drawings. Like reference numerals denote like elements throughout the drawings.

FIG. 1 is a block diagram of a semiconductor device 100 according to an embodiment of the present invention. As shown, the semiconductor device 100 of this example includes a fuse unit 110, a plurality of multiplexers MUX<2:n>, a latch unit 150, and a comparator 190.

The fuse unit 110 includes a plurality (n) of fuse sets 110_<1:n>, each of which includes one or more fuses. For convenience of explanation, an example is presented later with reference to FIG. 2 in which each of the fuse sets 110_1, 110_2, . . . , 110n includes a single fuse. The fuse sets 110_<1:n> output respective fuse information FINFO[<1:n>] indicative of whether the fuse or fuses thereof have been cut. For example, the fuse information FINFO may be a first voltage when the fuse or fuses of the corresponding fuse set 110 has been cut, and a second voltage when the fuse or fuses has not been cut.

Still referring to FIG. 1, the latch unit 150 includes a plurality (n) of latches 150_<1:n>. An input of each of the latches 150_<1:n> is connected to receive a respective fuse information FINFO[<1:n>] from the fuse sets 110_<1:n>.

In the example of FIG. 1, the latches 150_<1:n> are connected in series through the multiplexers MUX<2:n>.

More particularly, each multiplexer MUX<m> (where m equals 2 to n) has one input ("0") connected to the output of the latch 150_<m−1>, and an output connected to the input of the latch 150_<m>. Another input ("1") of each multiplexer MUX<m> is connected to the output of the fuse set 110_<m>.

Each multiplexer MUX<m> is responsive to a scan enable signal SCAN_EN to apply either the fuse cut information FINFO<m> or the output of the sequentially preceding latch 150_<m−1> to the input of the corresponding latch 150_<m>. Further, each of the latches 150_<1:n> is responsive to the activation of a scan clock signal SCAN_CLK to latch its input to its output.

As such, as will be explained in more detail below, the fuse cut information FINFO[1], FINFO[2], . . . , FINFO[n] may be loaded into the respective latches 150_<1:n>, and then sequentially transmitted through the latches 150_<1:n>. In this example, the sequential output signal from the nth latch 150_n will be indicative of the fuse cut information FINFO[n], FINFO[n−1], . . . , FINFO[1], in that sequential order.

More precisely, when the scan enable signal SCAN_EN is deactivated, the multiplexers MUX<2:n> output the respective fuse cut information FINFO[<2:n>]. Thus, when the scan clock SCAN_CLK is activated, the fuse cut information FINFO[<1:n>] are respectively loaded into the latches 150_<1:n>. That is, in this example, the fuse cut information FINFO[1] is directly loaded into the latch 150_1, while the fuse cut information FINFO[<2:n] are loaded in the latches 150_<2:n> through the respective multiplexers MUX<2:n>.

Then, when the scan enable signal SCAN_EN is activated, each multiplexer MUX<m> applies the output of the sequentially preceding latch 150_<m−1> to the input of the corresponding latch 150_<m>. In this state, whenever the scan clock SCAN_CLK is activated, the fuse cut information is sequentially transmitted through the latches 150_<1:n>. The sequential output signal from the nth latch 150_n will be indicative of the fuse cut information FINFO[n], FINFO[n−1], FINFO[1], in that sequential order.

In an embodiment of the present invention, referring to FIG. 1, the semiconductor device 100 may further include a comparator 190. The comparator 190 compares the fuse cut information FINFO[n], FINFO[−1], ..., FINFO[1] that are sequentially output from the $n^{th}$ latch 150_n, with corresponding fuse cut information FCUT[n], FCUT[n−1], ..., FCUT[1] that are set by a user. Further, the comparator 190 outputs fuse cut error information LOC_FAIL[n] through LOC_FAIL[1] based on a comparison result.

The comparator 190 may, for example, execute an XOR operation or an XNOR operation. In the case of an XOR operation, each time the comparison result shows that the fuse cut information FINFO[1:n] is not identical to the corresponding set fuse cut information FCUT[1:n], the fuse cut error information LOC_FAIL[1:n] is logic "1". In the case of an XNOR operation, each time the comparison result shows that the fuse cut information FINFO[1:n] is not identical to the corresponding set fuse cut information FCUT[1:n], the fuse cut error information LOC_FAIL[1:n] is logic "0".

It is noted that the comparator 190 is optional, and that instead, for example, a comparator function may be remotely from the remaining components illustrated in FIG. 1.

Figure 2:
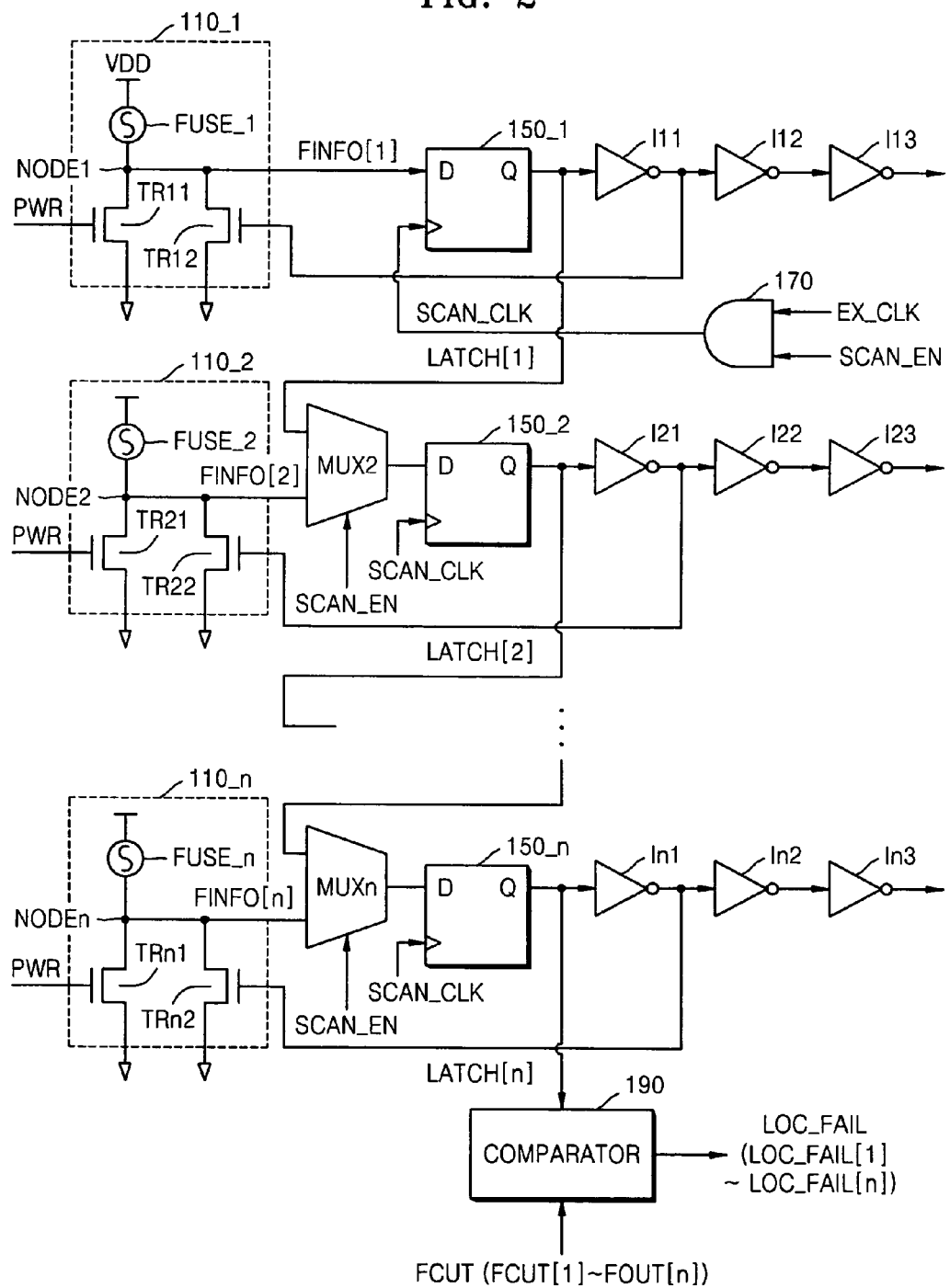
FIG. 2 is a circuit diagram of the semiconductor device illustrated in FIG. 1 according to an embodiment of the present invention.

FIG. 2 is an exemplary circuit diagram of the semiconductor device 100 illustrated in FIG. 1 according to an embodiment of the present invention. Like elements are denoted by like reference numbers in FIGS. 1 and 2, and a detailed operational description of FIG. 2 is omitted below to avoid redundancy.

Referring to FIG. 2, the fuse sets 110_<1:n> each include a respective fuse FUSE_<1:n> and respective transistors TR<1:n>1 and TR<1:n>2. Fuse set 100_1 is described below, and it will be understood that the remaining fuse sets 100_<2:n> operate in a similar manner.

Referring to fuse set 110_1 of FIG. 2, the fuse FUSE_1 is connected between a first reference voltage (e.g., VDD) and a node NODE1, and the transistors TR11 and TR12 are connected in parallel between the node NODE1 and a second reference voltage (e.g., ground voltage). Assuming that a fuse mode signal PWR remains logic high when the fuse cut information is output, when the fuse FUSE1 is cut, transistors TR11 and TR12 allow the voltage of a node NODE1 to go low. In detail, transistor TR11 makes the voltage of the node NODE1 go low. Accordingly, the output of the inverter I11 goes high and transistor TR12 is turned on. Therefore, transistor TR12 makes the voltage of the node NODE1 go lower. If the fuse FUSE1 is not cut, application of supply voltage VDD causes the voltage of the node NODE1 to go high. In detail, VDD makes the voltage of the node NODE1 go high. In this case, transistor TR11 is turned on. But, in general, the capacity of the transistor TR11 is small. Therefore, transistor TR11 has smaller influence on the voltage of the node NODE1 than VDD. Thus, each fuse cut information FINFO[1], FINFO[2], ..., FINFO[n] has high voltage or low voltage depending on whether the fuses FUSE_1, FUSE_2, ..., FUSE_n are cut.

The scan clock SCAN_CLK may be an internal clock of the semiconductor device 100. Also, as shown in FIG. 2, the semiconductor device 100 may further include a scan clock generator 170 that generates the scan clock SCAN_CLK. The scan clock generator 170 may, for example, generate a scan clock SCAN_CLK from a combination of an external clock EX_CLK and the scan enable signal SCAN_EN. For example, the scan clock generator 170 may be an AND gate. In this case, the scan clock SCAN_CLK is generated only when the scan enable signal SCAN_EN is activated.

As described above, the first through $n^{th}$ latches 150_1, 150_2, ..., 150n latch the fuse cut information FINFO[1], FINFO[2], ..., FINFO[n] or transmit them to their subsequent latches, when the scan clock SCAN_CLK is activated.

The first through $n^{th}$ latch 150_1, 150_2, ..., 150n may be flip-flop circuits as shown in FIG. 2. The flip-flops receive the fuse cut information FINFO[1], FINFO[2], ..., FINFO[n] via their input terminals D, and output the same via their output terminals Q, in response to the scan clock SCAN_CLK.

As shown in FIG. 2, the semiconductor device 100 may further includes a plurality of delay circuit (e.g., invertors) I[1:n]1 through I[1:n]3 connected in series to the outputs of the flip-flop circuits 150_[1:n]. As will be understood by those of ordinary skill, the delay circuits may be utilized to output the fuse cut information FINFO[1:n] in parallel.

Figure 3:
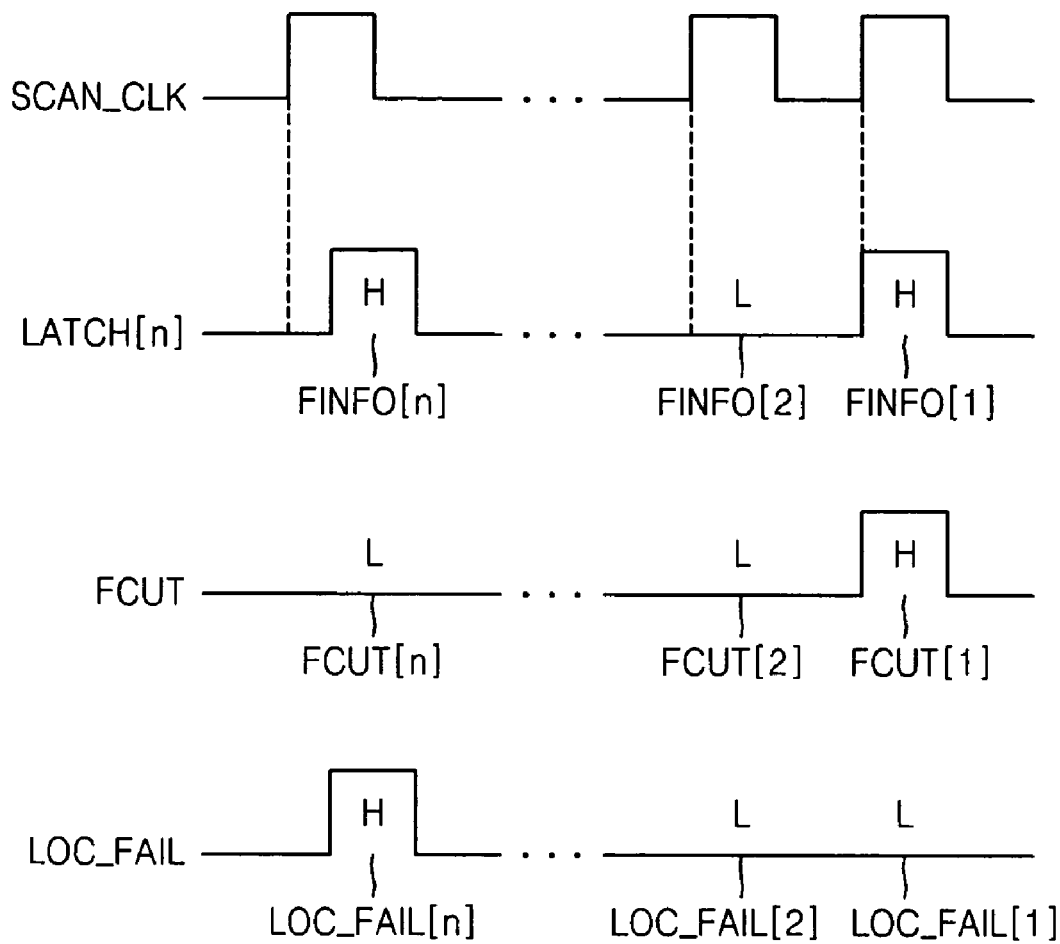
FIG. 3 is a timing diagram for explaining the operation of the semiconductor device illustrated in FIG. 1 according to an embodiment of the present invention.

FIG. 3 is a timing diagram illustrating the operation of the semiconductor device 100 of FIG. 1.

As described previously, the multiplexers MUX2 through MUXn are initially set to respectively select the fuse cut information FINFO[1], FINFO[2], ..., FINFO[n] output from the fuse sets 110_1, 110_2, ..., 110n. Then, the scan enable signal SCAN_EN is activated, which causes the multiplexers MUX2 through MUXn to sequentially transmit the fuse cut information FINFO[1], FINFO[2], ..., FINFO[n] which are eventually output as latch data LATCH[n] from the latch 150_n.

FIG. 3 illustrates the scan clock signal SCAN_CLK and the latch data LATCH[n] output from the latch 150_n. As just mentioned, the latch data LATCH[n] includes the fuse cut information FINFO[n], FINFO[n−1], ..., FINFO[1]. FIG. 3 also illustrates the user-set fuse cut data FCUT. The user-set fuse cut data FCUT includes set fuse cut information FCUT[n], FCUT[n−1], ..., FCUT[1]. As shown in the example of FIG. 3, each time the fuse cut information FINFO[n:1] fails to match the corresponding set fuse cut information FCUT[n:1], a comparison result output signal LOC_FAIL is logic "high".

As described above, a semiconductor device and a test system according to the present invention are capable of sequentially outputting a plurality of fuse cut information by utilizing a plurality of latches connected in series, thereby facilitating checking of whether a fuse cut error has occurred.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor device comprising:
    a plurality of fuses;
    a plurality of latches respectively electrically connected to the plurality of fuses, the plurality of latches configured to store respective fuse-cut information from the plurality of fuses, and to sequentially transmit the fuse-cut information through at least one other latch of the plurality of latches to output sequential data indicative of a fuse-cut state of the plurality of fuses during a test scan; and
    a comparator comparing the sequential data indicative of the fuse-cut state of the plurality of fuses with user set fuse-cut information, and to output fuse cut error information based on a comparison result.

2. The semiconductor device of claim 1, further comprising:

a plurality of multiplexers, each multiplexer selectively outputting one of fuse cut information output from a latch preceding a latch corresponding to the multiplexer and fuse cut information of a fuse corresponding to the corresponding latch, in response to a scan enable signal.

3. The semiconductor device of claim 2, wherein each of the multiplexers outputs the fuse cut information of the corresponding fuse, and then outputs the fuse cut information received from the preceding latch to the corresponding latch.

4. A semiconductor device comprising:
first through n fuse sets, each comprising at least one fuse, where n is a positive integer, the first through n fuse sets outputting respective first through n fuse cut information indicative of whether the respective at least one fuse is in a cut state;
first through n latches which respectively latch the first through n fuse cut information output from the respective first through n fuse sets; and
a comparator which compares the first through n fuse cut information output from the $n^{th}$ latch with respective user set first through n fuse cut information,
wherein the first through n latches are configured to selectively transmit the first through n fuse cut information so as to be sequentially output from the $n^{th}$ latch during a test scan.

5. The semiconductor device of claim 4, further comprising:
first through m multiplexers, wherein m is a positive integer from 1 through n−1, each $m^{th}$ multiplexer including:
a first input which receives the $(m+1)^{th}$ fuse cut information;
a second input connected an output of the $m^{th}$ latch; and
an output connected to an input of the $(m+1)^{th}$ latch.

6. The semiconductor device of claim 5, wherein each multiplexer outputs the first input when a scan enable signal is deactivated, and outputs the second input when the scan enable signal is activated.

7. The semiconductor device of claim 5, wherein each multiplexer is operative in a first mode to output the first input, and in a subsequent second mode to output the second input.

8. The semiconductor device of claim 4, wherein the comparator executes an XOR operation or an XNOR operation.

9. The semiconductor device of claim 4, wherein each of the first through n latches is activated by a scanning clock signal.

10. The semiconductor device of claim 9, wherein the scanning clock signal is generated based on a scan enable signal and an external clock signal.

11. The semiconductor device of claim 4, wherein each of the first through n latches is a flip-flop circuit.

12. A test system comprising:
a plurality of fuses;
a plurality of latches respectively electrically connected to the plurality of fuses, the plurality of latches configured to store respective fuse-cut information from the plurality of fuses, and to sequentially transmit the fuse-cut information through at least one other latch in a test scan to output sequential data indicative of a fuse-cut state of the plurality of fuses; and
a test device which outputs fuse cut error information based on the sequential data indicative of the fuse-cut state of the plurality of fuses,
wherein the sequential data indicative of the fuse-cut state of the plurality of fuses is compared with user set fuse-cut information to output the fuse cut error information.

13. The test system of claim 12, further comprising:
a plurality of multiplexers, each multiplexer selectively outputting one of fuse cut information received from a latch preceding a latch corresponding to the multiplexer and the fuse cut information of a fuse corresponding to the corresponding latch, in response to a scan enable signal.

* * * * *